(12) United States Patent
Tseng et al.

(10) Patent No.: US 11,887,842 B2
(45) Date of Patent: Jan. 30, 2024

(54) SPLICED MICRO LIGHT-EMITTING-DIODE DISPLAY PANEL

(71) Applicant: PlayNitride Display Co., Ltd., MiaoLi County (TW)

(72) Inventors: Chun-Ming Tseng, MiaoLi County (TW); Wei-Ping Lin, MiaoLi County (TW); Gwo-Jiun Sheu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 259 days.

(21) Appl. No.: 17/219,891

(22) Filed: Apr. 1, 2021

(65) Prior Publication Data

US 2022/0059608 A1 Feb. 24, 2022

Related U.S. Application Data

(60) Provisional application No. 63/069,693, filed on Aug. 24, 2020.

(30) Foreign Application Priority Data

Dec. 3, 2020 (TW) .................................. 109142527

(51) Int. Cl.
*H01L 27/15* (2006.01)
*H01L 33/62* (2010.01)
*H01L 33/48* (2010.01)

(52) U.S. Cl.
CPC .......... *H01L 27/156* (2013.01); *H01L 33/486* (2013.01); *H01L 33/62* (2013.01)

(58) Field of Classification Search
CPC ..... H01L 27/156; H01L 33/486; H01L 33/62; H01L 25/0753; H01L 25/167; H01L 33/58
See application file for complete search history.

(56) References Cited

U.S. PATENT DOCUMENTS 10,192,950 B2 1/2019 Jung et al.
10,546,913 B2 1/2020 Lee et al.
(Continued)

FOREIGN PATENT DOCUMENTS

CN 208315549 1/2019
CN 209215803 8/2019
(Continued)

OTHER PUBLICATIONS

"Office Action of China Counterpart Application", dated Jul. 27, 2022, p. 1-p. 7.

(Continued)

*Primary Examiner* — Jonathan Han
(74) *Attorney, Agent, or Firm* — JCIPRNET

(57) ABSTRACT

A spliced micro light-emitting-diode display panel includes multiple circuit boards spliced with each other and multiple micro light-emitting-diode modules. Each circuit board includes at least one driver IC. The micro light-emitting-diode modules are disposed separately on each circuit board and are electrically connected to the driver IC. Each micro light-emitting-diode module includes multiple light-emitting-diode units arranged in an array. On each circuit board, the driver IC drives the light-emitting-diode units of the micro light-emitting-diode modules to emit light. There is a first gap between any adjacent two of the light-emitting-diode units on any adjacent two of the circuit boards, and there is a second gap between any adjacent two of the light-emitting-diode units on each micro light-emitting-diode module, and the first gap is smaller than the second gap.

18 Claims, 5 Drawing Sheets

(56) References Cited

U.S. PATENT DOCUMENTS

| | | | |
|---|---|---|---|
| 2012/0256814 A1* | 10/2012 | Ootorii | G09G 3/3208 |
| | | | 345/82 |
| 2016/0197134 A1* | 7/2016 | Jung | G02F 1/13452 |
| | | | 257/40 |
| 2016/0267860 A1 | 9/2016 | Liu et al. | |
| 2018/0197461 A1 | 7/2018 | Lai et al. | |
| 2019/0012956 A1 | 1/2019 | Li et al. | |
| 2019/0305073 A1 | 10/2019 | Chen et al. | |
| 2019/0347979 A1* | 11/2019 | Ahmed | G02B 3/0056 |
| 2020/0111391 A1* | 4/2020 | Chao | H01L 25/0753 |
| 2020/0126475 A1* | 4/2020 | Ting | H01L 27/1214 |

FOREIGN PATENT DOCUMENTS

| | | |
|---|---|---|
| CN | 110379322 | 10/2019 |
| CN | 111081694 | 4/2020 |
| CN | 210666266 | 6/2020 |
| KR | 20170094148 | 8/2017 |
| KR | 20190114767 | 10/2019 |
| KR | 20200027891 | 3/2020 |
| KR | 20200028574 | 3/2020 |
| TW | 202015269 | 4/2020 |

OTHER PUBLICATIONS

"Office Action of Taiwan Counterpart Application", dated Oct. 29, 2021, p. 1-p. 5.

"Office Action of Korea Counterpart Application", with English translation thereof, dated Jan. 19, 2023, p. 1-p. 11.

"Notice of allowance of Taiwan Related Application, Application No. 111113636", dated Oct. 17, 2023, p. 1-p. 4.

* cited by examiner

SPLICED MICRO LIGHT-EMITTING-DIODE DISPLAY PANEL

CROSS-REFERENCE TO RELATED APPLICATION

This application claims the priority benefits of U.S. provisional application Ser. No. 63/069,693, filed on Aug. 24, 2020, and Taiwan application serial no. 109142527, filed on Dec. 3, 2020. The entirety of the above-mentioned patent application is hereby incorporated by reference herein and made a part of this specification.

BACKGROUND

Technical Field

The disclosure relates to a display panel, particularly to a spliced micro light-emitting-diode display panel.

Description of Related Art

The conventional technology splices the display screens by encapsulating the red light-emitting diode, the green light-emitting diode, and the blue light-emitting diode one by one before mounting them to the driving circuit board one by one. Therefore, there are limitations for their size and spacing, and the bonding yield is also not satisfying. In recent years, the encapsulation combining micro light-emitting diodes with integrated circuits (IC) have also been developed, but its bonding is still time-consuming.

SUMMARY

The present disclosure provides a spliced micro light-emitting-diode display panel configured by combining micro light-emitting-diode modules in a smaller size together and forming a display panel in a larger size, which is capable of reducing the transfer time, improving the bonding yield, and/or providing a better display quality.

The spliced micro light-emitting-diode display panel of the present disclosure includes multiple circuit boards spliced with each other and multiple micro light-emitting-diode modules. Each of the circuit boards includes at least one driver IC. The micro light-emitting-diode modules are separately disposed on each of the circuit boards and are electrically connected to the driver IC. Each of the micro light-emitting-diode modules includes multiple light-emitting-diode units arranged in an array. On each of the circuit boards, the driver IC drives the light-emitting-diode units of the micro light-emitting-diode modules to emit light. There is a first gap between any adjacent two of the light-emitting-diode units respectively disposed on any adjacent two of the circuit boards, and there is a second gap between any adjacent two of the light-emitting-diode units on each micro light-emitting-diode module. The first gap is smaller than the second gap.

In an embodiment of the present disclosure, the ratio of the first gap to the second gap is less than 1 and greater than or equal to 0.85.

In an embodiment of the present disclosure, the micro light-emitting-diode module and the driver IC are respectively disposed on two opposite sides of each circuit board.

In an embodiment of the present disclosure, there is a third gap between any adjacent two of the micro light-emitting-diode modules on any adjacent two of the circuit boards, and the third gap is smaller than the first gap.

In an embodiment of the present disclosure, the spliced micro light-emitting-diode display panel further includes multiple light-shielding parts disposed on the circuit boards and located between the micro light-emitting-diode modules.

In an embodiment of the present disclosure, a first height of each light-shielding part is less than or equal to a second height of each micro light-emitting-diode module.

In an embodiment of the present disclosure, the spliced micro light-emitting-diode display panel further includes multiple connecting components disposed between the micro light-emitting-diode modules and the circuit boards. The micro light-emitting-diode modules are electrically connected and fixed to the circuit boards through the connecting components. Parts of the connecting components protrude from the edge of a corresponding one of the micro light-emitting-diode modules and are covered by a corresponding one of the light-shielding parts.

In an embodiment of the present disclosure, each micro light-emitting-diode module further includes a multilayer circuit layer, multiple micro light-emitting diodes, and a light-transmitting flat layer. The multilayer circuit layer includes a top circuit layer and a bottom circuit layer, and the bottom circuit layer includes multiple pads. The micro light-emitting diodes are disposed on the top circuit layer of the multilayer circuit layer, and define the light-emitting-diode units. Each light-emitting-diode unit includes three micro light-emitting diodes disposed separately from one other, and the orthographic projection of each light-emitting-diode unit on the bottom circuit layer completely overlaps within the corresponding pad. The light-transmitting flat layer covers the top circuit layer of the multilayer circuit layer and the micro light-emitting diodes.

In an embodiment of the present disclosure, the multilayer circuit layer further includes at least one internal circuit layer and multiple dielectric layers. The internal circuit layer is located between the top circuit layer and the bottom circuit layer, whereas the dielectric layers are located between the top circuit layer, the internal circuit layer, and the bottom circuit layer.

In an embodiment of the present disclosure, the multilayer circuit layer further includes multiple conductive vias, in which the top circuit layer, the internal circuit layer, and the bottom circuit layer are electrically connected through the conductive vias. The orthographic projections of the conductive vias on the bottom circuit layer do not overlap with the orthographic projection of the micro light-emitting diodes on the bottom circuit layer.

In an embodiment of the present disclosure, the internal circuit layer includes multiple circuits, and the orthographic projection of each light-emitting-diode unit on the bottom circuit layer completely overlaps within the corresponding circuit.

In an embodiment of the present disclosure, the circuit pattern density of the top circuit layer, the internal circuit layer, or the bottom circuit layer is greater than 50%.

In an embodiment of the present disclosure, each of the micro light-emitting-diode modules further includes an insulating layer disposed on the bottom circuit layer of the multilayer circuit layer and exposing parts of the pads.

In an embodiment of the present disclosure, each of the micro light-emitting-diode modules further includes a surface treatment layer disposed on the pad exposed by the insulating layer.

In an embodiment of the present disclosure, the pads respectively correspond to the connecting components, and the connecting components extend between the insulating layer and the circuit board.

In an embodiment of the present disclosure, each of the two micro light-emitting-diode modules further includes a light-blocking layer disposed on the top circuit layer of the multilayer circuit layer, and includes multiple blocking parts. The blocking part and the light-emitting-diode unit are alternately disposed.

In an embodiment of the present disclosure, a thickness of the light-blocking layer is greater than a thickness of each of the micro light-emitting diodes.

In an embodiment of the present disclosure, the spliced micro light-emitting-diode display panel further includes a light-transmitting glue layer and multiple light-shielding parts. The light-shielding parts are disposed on the circuit boards and are located between the micro light-emitting-diode modules. The light-transmitting glue layer covers the light-shielding part.

In an embodiment of the present disclosure, the height of the light-shielding part is not higher than the height of the light-blocking layer and not lower than the height of the light-emitting-diode units.

Based on the above, in the spliced micro light-emitting-diode display panel of the present disclosure, the micro light-emitting-diode modules are separately disposed on each of the circuit boards which are spliced together, in which a first gap existing between any adjacent two of the light-emitting-diode units on any adjacent two of the circuit boards is smaller a second gap existing between any adjacent two of the light-emitting-diode units on each of the micro light-emitting-diode modules. This way, by combining micro light-emitting-diode modules in a smaller size together and forming a display panel in a larger size, the transfer time may be reduced and the bonding yield may be improved, providing the spliced micro light-emitting-diode display panel of the present disclosure a better display quality.

In order to make the aforementioned features and advantages of the disclosure more comprehensible, embodiments accompanied with drawings are described in detail below.

DESCRIPTION OF THE EMBODIMENTS

Figure 1A:
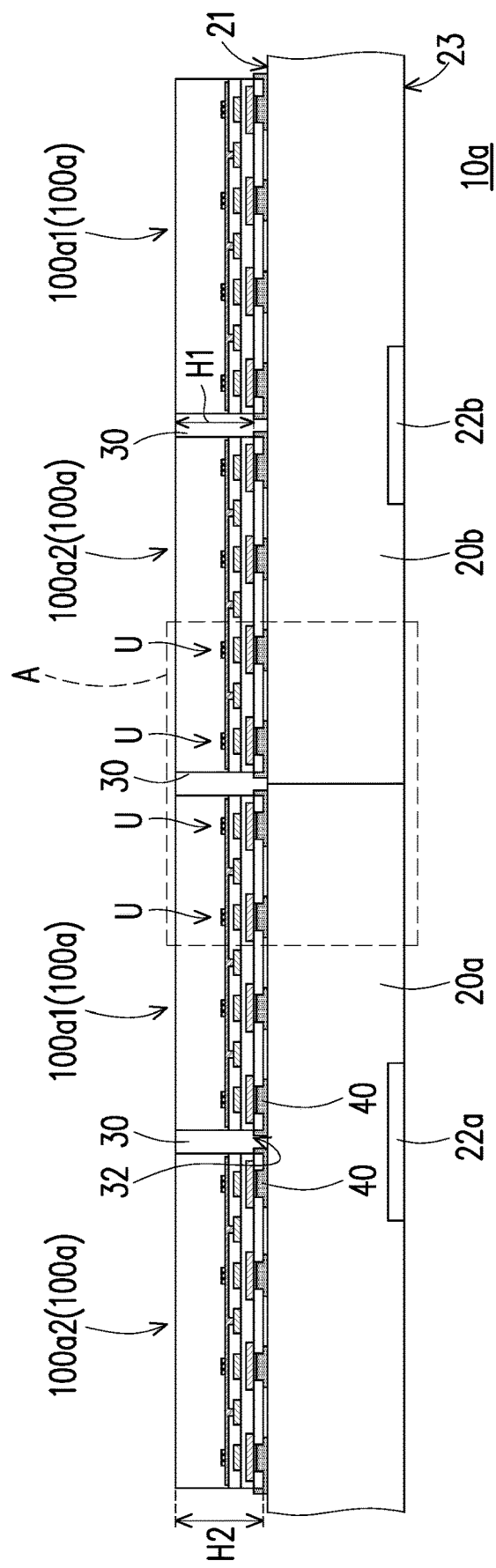
FIG. 1A is a schematic view of a spliced micro light-emitting-diode display panel according to an embodiment of the disclosure.
Figure 1B:
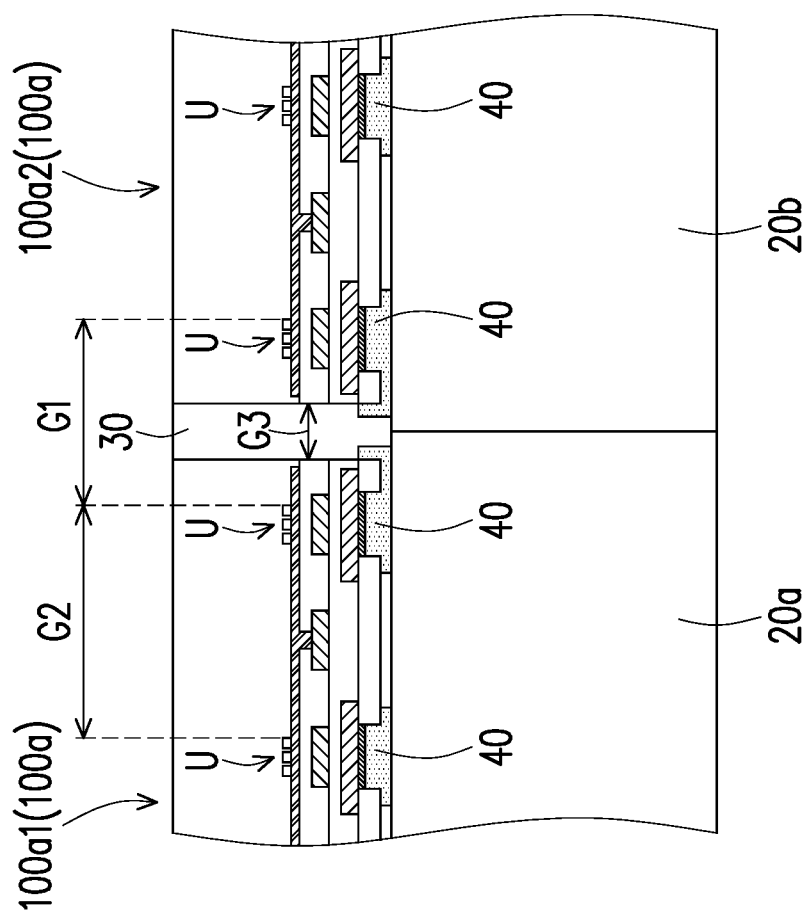
FIG. 1B is a partial enlarged schematic view of an area A in FIG. 1A.
Figure 2:
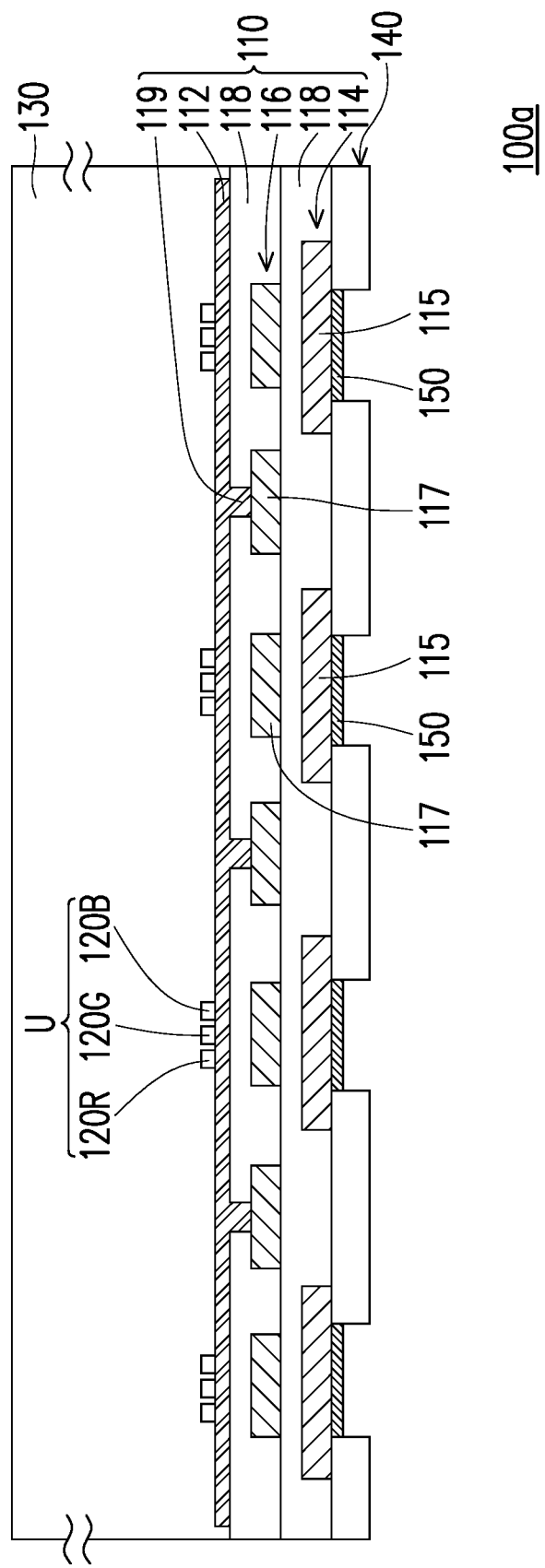
FIG. 2 is a schematic view of a micro light-emitting-diode module of the spliced micro light-emitting-diode display panel of FIG. 1A.

FIG. 1A is a schematic view of a spliced micro light-emitting-diode display panel according to an embodiment of the disclosure. FIG. 1B is a partial enlarged schematic view of an area A in FIG. 1A. FIG. 2 is a schematic view of a micro light-emitting-diode module of the spliced micro light-emitting-diode display panel of FIG. 1A.

Please refer to FIG. 1A and FIG. 1B at the same time. In this embodiment, a spliced micro light-emitting-diode display panel 10a includes a plurality of circuit boards (two circuit boards 20a and 20b are schematically shown) spliced with each other and a plurality of micro light-emitting-diode modules (four micro light-emitting-diode modules 100a are schematically shown). Each of the circuit board 20a and 20b includes at least one driver IC (each of the circuit boards 20a and 20b are schematically illustrated with one driver IC, such as driver ICs 22a and 22b). The micro light-emitting-diode modules 100a are separately disposed on each of the circuit boards 20a and 20b and are electrically connected with the driver ICs 22a and 22b, in which each of the micro light-emitting-diode modules 100a includes a plurality of light-emitting-diode units U disposed in an array. On each of the circuit boards 20a and 20b, the driver ICs 22a and 22b drive the light-emitting-diode units U of the micro light-emitting-diode modules 100a to emit light. Particularly, there is a first gap G1 between one light-emitting-diode unit U in a micro light-emitting-diode module 100a1 and another light-emitting-diode unit U in another micro light-emitting-diode module 100a2 that are on any adjacent two of the circuit boards 20a and 20b; and there is a second gap G2 between any adjacent two of the light-emitting-diode units U on each micro light-emitting-diode module 100a (that is, the pixel pitch, which is related to the resolution of the display panel), and the first gap G1 is smaller than the second gap G2. Herein, the first gap G1 is, for example, 250 μm to 400 μm, and the second gap G2 is, for example, 300 μm to 450 μm.

Since the process tolerance of the splicing of the circuit boards 20a and 20b is greater, the difference in splicing gap is large, causing the pixel pitch on the splicing seam to dislocate. If the pixel pitch on the splicing seam is larger than the normal pixel pitch, human eyes tend to detect the splicing seam more easily. Therefore, with the premise of taking the manufacturing process tolerance into consideration, the present disclosure directly reduces the splicing gap, so that the first gap G1 is smaller than the second gap G2, and adopts the subsequent picture adjustment to reduce the human eyes' perception of the splicing seam, improving the overall image quality of the integrated spliced micro light-emitting-diode display panel 10a. More specifically, the ratio of the first gap G1 to the second gap G2 is preferably less than 1 and greater than or equal to 0.85. In other words, the size difference between the first gap G1 and the second gap G2 should not be too large; otherwise the quality of the image is affected to an extent that the splicing traces are picked up by human eyes. It is worth mentioning that the viewing quality is better with a ratio ≥0.85 measured by the existing experiments.

Furthermore, there is a third gap G3 between any adjacent two of the micro light-emitting-diode modules 100a1 and 100a2 that are respectively on any adjacent two of the circuit boards 20a and 20b, and the third gap G3 is smaller than the first gap G1. Herein, the first gap G1 is, for example, 100 μm to 150 μm. Furthermore, in order to reduce the interference between the micro light-emitting-diode modules 100a1 and 100a2 to avoid the human eyes from perceiving the gap, the spliced micro light-emitting-diode display panel 10a of this embodiment further includes a plurality of light-shielding parts 30. The light-shielding parts 30 are disposed on the circuit boards 20a and 20b, and are located between the micro light-emitting-diode modules 100a1 and 100a2. Preferably, a first height H1 of each of the light-shielding parts 30 is less than or equal to a second height H2 of each of the micro light-emitting-diode modules 100a.

In addition, the spliced micro light-emitting-diode display panel 10a of this embodiment further includes a plurality of connecting components 40, in which the connecting components 40 are disposed between the micro light-emitting-diode modules 100a and the circuit boards 20a and 20b. The micro light-emitting-diode module 100a is electrically connected and fixed to the circuit boards 20a and 20b through the connecting components 40. Part of the connector 40 protrudes from the edge of a corresponding one of the micro light-emitting-diode modules 100a and is covered by a corresponding one the light-shielding parts 30. Herein, the micro light-emitting-diode modules 100a are electrically connected to the circuit boards 20a and 20b through the connecting components 40. The material of the connector 40 is, for example, a reflective metal material, but the disclosure is not limited thereto. Furthermore, the connector 40 is, for example, an indium bump or a tin bump, so that when the micro light-emitting-diode module 100a presses against them, they spread out and protrude from the edge of a corresponding one of the micro light-emitting-diode modules 100a. At this time, the light-shielding part 30 covers the edge of the connector 40 that protrudes from the edge of the micro light-emitting-diode module 100a (and even climbs on the side wall of the micro light-emitting-diode module 100a). It is worth mentioning that the light-shielding part 30 between any adjacent two of the micro light-emitting-diode modules 100a1 and 100a2 not only blocks the interference of the light-emitting-diode unit U between the micro light-emitting-diode modules 100a and fills the gaps to make human eyes less likely to detect the gaps, but also covers the exposed and reflective connecting components 40 and avoids affecting the visibility.

In addition, please refer to FIG. 1A again, in which the micro light-emitting-diode module 100a and the driver ICs 22a and 22b of this embodiment are respectively disposed on the two opposite sides of each of the circuit boards 20a and 20b, that is, disposed on an upper surface 21 and a lower surface 23 respectively. Note that the driver ICs 22a and 22b of this embodiment control a plurality of micro light-emitting-diode modules 100a on the same circuit boards 20a and 20b, and independently control the light emission of each of the micro light-emitting diodes 120R, 120G, and 120B. In other embodiments, each of the circuit boards 20a and 20b may also include multiple driver ICs, and also control multiple micro light-emitting-diode modules 100a on the same circuit board 20a and 20b respectively.

Furthermore, in FIG. 2, in this embodiment, each micro light-emitting-diode module 100a further includes a multilayer circuit layer 110, a plurality of micro-light-emitting diodes 120R, 120G, and 120B, and a light-transmitting flat layer 130. The multilayer circuit layer 110 includes a top circuit layer 112 and a bottom circuit layer 114, and the bottom circuit layer 114 includes a plurality of pads 115. The micro light-emitting diodes 120R, 120G, and 120B are disposed on the top circuit layer 112 of the multilayer circuit layer 110, and define a light-emitting-diode unit U. Each light-emitting-diode unit U includes three micro light-emitting diodes 120R, 120G, and 120B, separated from one another. Herein, the three micro light-emitting diodes 120R, 120G, and 120B of each light-emitting-diode unit U are respectively a red micro light-emitting diode, a green micro light-emitting diode, and a blue micro light-emitting diode. In particular, the orthographic projection of each light-emitting-diode unit U on the bottom circuit layer 114 completely overlaps within a corresponding one of the pads 115, providing better flatness. The light-transmitting flat layer 130 covers the top circuit layer 112 of the multilayer circuit layer 110 and the micro light-emitting diodes 120R, 120G, and 120B.

More specifically, the multilayer circuit layer 110 further includes at least one internal circuit layer (one internal circuit layer 116 is schematically shown) and a plurality of dielectric layers (two dielectric layers 118 are schematically shown). The internal circuit layer 116 is located between the top circuit layer 112 and the bottom circuit layer 114, and the dielectric layers 118 are located between the top circuit layer 112, the internal circuit layer 116, and the bottom circuit layer 114. In other words, the top circuit layer 112, the internal circuit layer 116, and the bottom circuit layer 114 are electrically isolated by the dielectric layers 118. In particular, the pattern density of the top circuit layer 112, the internal circuit layer 116, and the bottom circuit layer 114 in the multilayer circuit layer 110 of this embodiment is at least greater than 50%. The top circuit layer 112 and the internal circuit layer 116 occupy at least more than 50% of the circuit pattern density in each layer, and preferably up to 80%, making each of the layers flatter, which is beneficial to the subsequent flip-chip bonding process of the micro light-emitting diodes 120R, 120G, and 120B for improving the yield. In addition, the process constraints, such as the line width of exposure/etching, or the generation of parasitic capacitance between each layer may also be taken into consideration. Note that the density of the circuit pattern is preferably not more than 90%.

Furthermore, the multilayer circuit layer 110 of this embodiment further includes a plurality of conductive vias 119, in which the top circuit layer 112, the internal circuit layer 116, and the bottom circuit layer 114 are electrically connected through the conductive vias 119. In particular, the orthographic projection of the conductive via 119 on the bottom circuit layer 114 does not overlap with the orthographic projections of the micro light-emitting diodes 120R, 120G, and 120B on the bottom circuit layer 114. In other words, from a top view, the positions of the micro light-emitting diodes 120R, 120G, and 120B and the positions of the conductive vias 119 do not overlap at all. Furthermore, the internal circuit layer 116 of this embodiment includes a plurality of circuits 117, and the orthographic projection of each light-emitting-diode unit U on the bottom circuit layer 114 also completely overlaps within a corresponding one of the circuits 117.

In addition, in this embodiment, the micro light-emitting-diode module 100a further includes an insulating layer 140, and the insulating layer 140 is disposed on the bottom circuit layer 114 of the multilayer circuit layer 110, and part of the pad 115 is exposed. Furthermore, the insulating layer 140 covers the peripheral surface of each pad 115 and exposes the middle part of the pad 115. In addition, the micro light-emitting-diode module 100a of this embodiment further includes a surface treatment layer 150, and the surface treatment layer 150 is disposed on the pad 115 where it is exposed by the insulating layer 140. Preferably, the material of the surface treatment layer 150 is, for example, electroless nickel and immersion gold (ENIG), which prevents or reduce effectively the oxidation of the pad 115 where it is exposed by the insulating layer 140. Herein, the pads 115 respectively correspond to the connecting components 40, which means that one pad 115 corresponds to one connector 40, and the connector 40 extends to be located between the insulating layer 140 and the circuit boards 20a and 20b.

In sum, in this embodiment, the micro light-emitting-diode modules 100a in a smaller size are combined together and form a spliced micro light-emitting-diode display panel 10a in a larger size, reducing the transfer time, improving the bonding yield, and/or providing a better display quality.

It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 3:
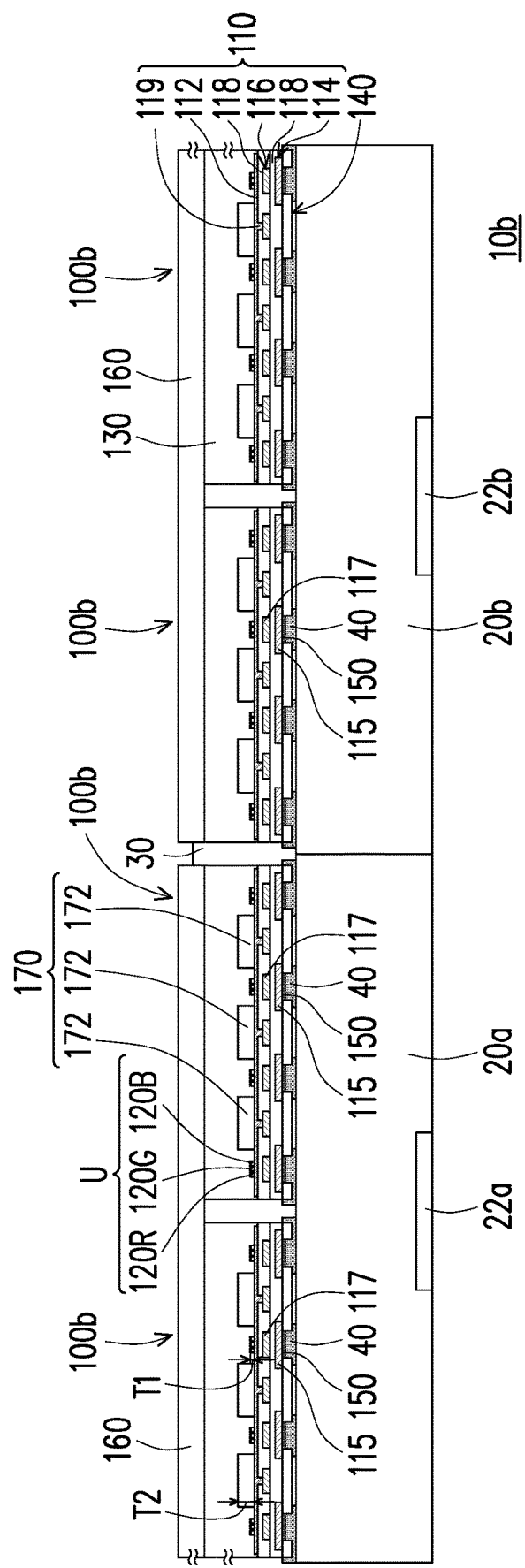
FIG. 3 is a schematic view of a spliced micro light-emitting-diode display panel according to another embodiment of the disclosure.

FIG. 3 is a schematic view of a spliced micro light-emitting-diode display panel according to another embodiment of the disclosure. Please refer to FIG. 3, FIG. 2 and FIG. 1A at the same time. The micro light-emitting-diode display module 100b of this embodiment is similar to the micro light-emitting-diode display module 100a of FIG. 2. The difference between the two is that in this embodiment, the spliced micro light-emitting-diode display panel 10b further includes a plurality of light-transmitting substrates 160, which are disposed on a light-transmitting flat layer 130. And the light-transmitting flat layer 130 is located between the light-transmitting substrate 160 and the multilayer circuit layer 110. In addition, the micro light-emitting-diode module 100b of this embodiment further includes a light-blocking layer 170, which is disposed on the top circuit layer 112 of the multilayer circuit layer 110 and includes a plurality of blocking parts 172. The blocking part 172 and the light-emitting-diode unit U are disposed alternately. Preferably, a thickness T2 of the light-blocking layer 170 is greater than a thickness T1 of each of the micro light-emitting diodes 120R, 120G, and 120B. For example, the thickness T1 of the micro light-emitting diodes 120R, 120G, and 120B is, for example, less than 10 µm, and the thickness T2 of the light-blocking layer 170 is, for example, 20 µm. The light-transmitting substrate 160 is, for example, a glass cover plate, an optical film, etc., that is covered on all the micro light-emitting-diode modules 100b on each of the circuit boards 20a and 20b through lamination technology, which is capable of fixing the problem of light leakage from the gaps of the micro light-emitting-diode module 100b and improving the poor viewing quality.

Since the spliced micro light-emitting-diode display panel 10b of this embodiment includes a light-transmitting substrate 160, which may be an optical film, that covers all the micro light-emitting-diode modules 100b on the circuit boards 20a and 20b in a large area, the gaps between the micro light-emitting-diode display module 100b less obvious, and further improves the viewing quality of the spliced micro light-emitting-diode display panel 10b. Alternatively, in another embodiment, the light-transmitting substrate 160 is, for example, a glass cover plate, which enhances the structural strength of the spliced micro light-emitting diode display panel 10b and improves the process yield. In addition, the micro light-emitting-diode display module 100b of this embodiment further includes a light-blocking layer 170, so that each light-emitting-diode unit U has a better light-emitting effect, and the micro light-emitting-diode display module 100b has a better display effect, the spliced micro light-emitting-diode display panel 10b thereby provides a better display quality.

Figure 4:
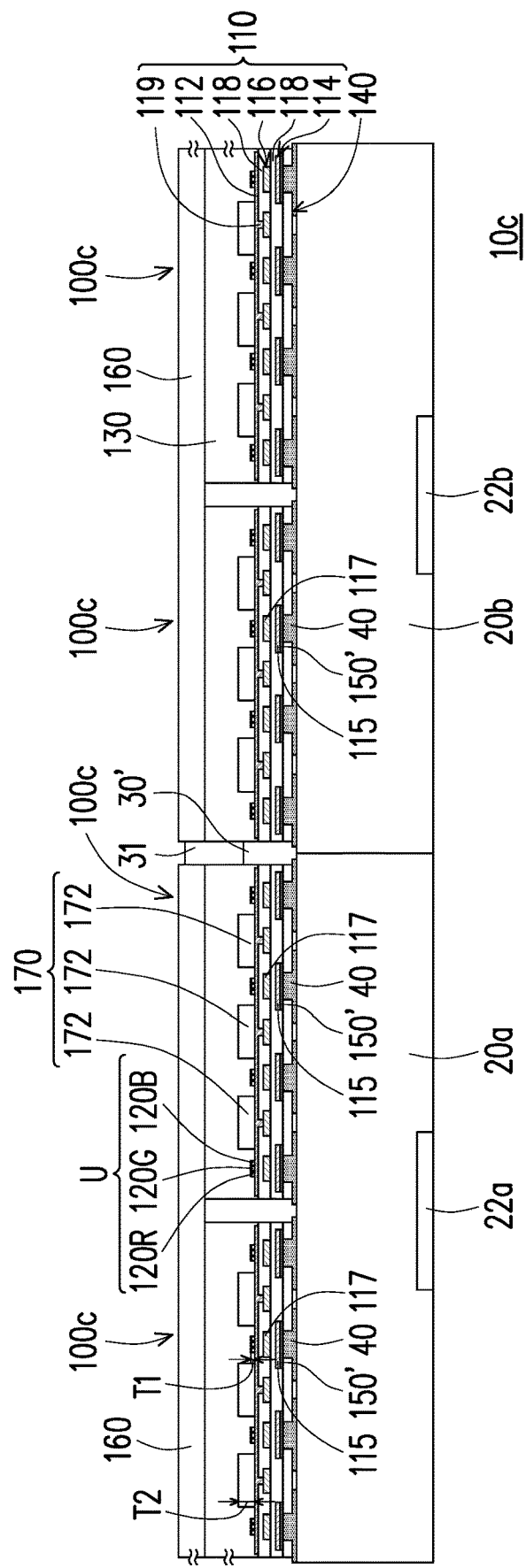
FIG. 4 is a schematic view of a spliced micro light-emitting-diode display panel according to another embodiment of the disclosure.

FIG. 4 is a schematic view of a spliced micro light-emitting-diode display panel according to another embodiment of the disclosure. Please refer to FIG. 4 and FIG. 3 at the same time. The spliced micro light-emitting-diode display panel 10c of this embodiment is similar to the spliced micro light-emitting-diode display panel 10b of FIG. 3. The main difference between the two is that in this embodiment, the spliced micro light-emitting-diode display panel 10c further has a light-transmitting glue layer 31 adapted to cover a light-shielding part 30'. In particular, the height of the light-shielding part 30' in this embodiment is not higher than the height of the light-blocking layer 170 in the micro light-emitting-diode display module 100c, and preferably not lower than the height of the light-emitting-diode unit U. If the light-shielding part 30' in the splicing seam is too high, it may cause the boundary between the micro light-emitting-diode display modules 100c to be seen when viewed from the side, which affects the viewing quality. In contrast, if the light-shielding part 30' is too low, the color interference between the light-emitting-diode units U cannot be solved. Another difference between the two is that the surface treatment layer 150' of this embodiment is completely disposed on the surface of the pad 115, whereas the insulating layer 140 covers part of the surface of the surface treatment layer 150'. With this structural design, the surface treatment layer 150' can be reactively performed directly on the pad 115, and then the insulating layer 140 can be set, which simplifies the process steps and improves the process yield.

In sum, in the spliced micro light-emitting-diode display panel of the present disclosure, the micro light-emitting-diode modules are separately disposed on each of the circuit boards which are spliced together, in which a first gap existing between any adjacent two of the light-emitting-diode units on any adjacent two of the circuit boards is smaller a second gap existing between any adjacent two of the light-emitting-diode units on each of the micro light-emitting-diode modules. This way, by combining micro light-emitting-diode modules in a smaller size together and forming a display panel in a larger size, the transfer time may be reduced, and the bonding yield may be improved, providing the spliced micro light-emitting-diode display panel of the present disclosure a better display quality.

Although the disclosure has been disclosed by the above embodiments, they are not intended to limit the disclosure. To any one of ordinary skill in the art, modifications and embellishment to the disclosed embodiments may be made without departing from the spirit and the scope of the disclosure. Accordingly, the scope of the disclosure is defined by the claims attached below and their equivalents.

What is claimed is:

1. A spliced micro light-emitting-diode display panel, comprising:
   a plurality of circuit boards, spliced with each other, wherein each of the plurality of circuit boards comprises at least one driver IC; and
   a plurality of micro light-emitting-diode modules, disposed separately on each of the plurality of circuit boards and connected electrically with the at least one driver IC, wherein each of the plurality of micro light-emitting-diode modules comprises a plurality of light-emitting-diode units disposed in an array, on each of the plurality of circuit boards, the at least one driver IC drives the plurality of light-emitting-diode units of the plurality of micro light-emitting-diode modules to emit light, wherein a first gap exists between any adjacent two of the plurality of light-emitting-diode units respectively on any adjacent two of the plurality of circuit boards, and a second gap exists between any adjacent two of the plurality of light-emitting-diode units on each of the plurality of micro light-emitting-diode modules, and the first gap is smaller than the second gap, wherein each of the plurality of micro light-emitting-diode modules further comprises:
a multilayer circuit layer, comprising a top circuit layer and a bottom circuit layer, wherein the bottom circuit layer comprises a plurality of pads;
a plurality of micro light-emitting diodes, disposed on the top circuit layer of the multilayer circuit layer, and adapted to define the plurality of light-emitting-diode units, wherein each of the plurality of light-emitting-diode units comprises three of the plurality of micro light-emitting diodes separated from each other, and an orthographic projection of each of the plurality of light-emitting-diode units on the bottom circuit layer completely overlaps within a corresponding one of the plurality of pads; and
a light-transmitting flat layer, adapted to cover the top circuit layer of the multilayer circuit layer and the plurality of micro light-emitting diodes.

2. The spliced micro light-emitting-diode display panel according to claim 1, wherein a ratio of the first gap to the second gap is less than 1 and greater than or equal to 0.85.

3. The spliced micro light-emitting-diode display panel according to claim 1, wherein the plurality of micro light-emitting-diode modules and the at least one driver IC are respectively disposed on two opposite sides of each of the plurality of circuit boards.

4. The spliced micro light-emitting-diode display panel according to claim 1, wherein a third gap exists between any adjacent two of the plurality of micro light-emitting-diode modules on any adjacent two of the plurality of circuit boards, and the third gap is smaller than the first gap.

5. The spliced micro light-emitting-diode display panel according to claim 1, further comprising:
a plurality of light-shielding parts, disposed on the plurality of circuit boards and located between the plurality of micro light-emitting-diode modules.

6. The spliced micro light-emitting-diode display panel according to claim 5, wherein a first height of each of the plurality of light-shielding parts is less than or equal to a second height of each of the plurality of micro light-emitting-diode modules.

7. The spliced micro light-emitting-diode display panel according to claim 5, further comprising:
a plurality of connecting components, disposed between the plurality of micro light-emitting-diode modules and the plurality of circuit boards, wherein the plurality of micro light-emitting-diode modules are electrically connected and fixed to the plurality of circuit boards through the plurality of connecting components, and part of each of the plurality of connecting components protrudes from an edge of a corresponding one of the plurality of micro light-emitting-diode modules and is covered by a corresponding one of the plurality of light-shielding parts.

8. The spliced micro light-emitting-diode display panel according to claim 1, wherein the multilayer circuit layer further comprises at least one internal circuit layer and a plurality of dielectric layers, the at least one internal circuit layer is located between the top circuit layer and the bottom circuit layer, and the plurality of dielectric layers are located between the top circuit layer, the at least one internal circuit layer, and the bottom circuit layer.

9. The spliced micro light-emitting-diode display panel according to claim 8, wherein the multilayer circuit layer further comprises a plurality of conductive vias, the top circuit layer, the at least one internal circuit layer, and the bottom circuit layer are electrically connected through the plurality of conductive vias, and orthographic projections of the plurality of conductive vias on the bottom circuit layer do not overlap with orthographic projections of the plurality of micro light-emitting diodes on the bottom circuit layer.

10. The spliced micro light-emitting-diode display panel according to claim 8, wherein the at least one internal circuit layer comprises a plurality of circuits, and an orthographic projection of each of the plurality of light-emitting-diode units on the bottom circuit layer completely overlaps within a corresponding one of the plurality of circuits.

11. The spliced micro light-emitting-diode display panel according to claim 8, wherein a circuit pattern density of the top circuit layer, the at least one internal circuit layer, or the bottom circuit layer is greater than 50%.

12. The spliced micro light-emitting-diode display panel according to claim 1, wherein each of the plurality of micro light-emitting-diode modules further comprises:
an insulating layer, disposed on the bottom circuit layer of the multilayer circuit layer and adapted to expose parts of the plurality of pads.

13. The spliced micro light-emitting-diode display panel according to claim 12, wherein each of the plurality of micro light-emitting-diode modules further comprises:
a surface treatment layer, disposed on the parts of the plurality of pads exposed by the insulating layer.

14. The spliced micro light-emitting-diode display panel according to claim 13, wherein the plurality of pads respectively correspond to the plurality of connecting components, and the connecting components extend to be located between the insulating layer and the plurality of circuit boards.

15. The spliced micro light-emitting-diode display panel according to claim 1, wherein each of the plurality of micro light-emitting-diode modules further comprises:
a light-blocking layer, disposed on the top circuit layer of the multilayer circuit layer and adapted to comprise a plurality of blocking parts, wherein the plurality of blocking parts and the plurality of light-emitting-diode units are disposed alternately.

16. The spliced micro light-emitting-diode display panel according to claim 15, wherein a thickness of the light-blocking layer is greater than a thickness of each of the plurality of micro light-emitting diodes.

17. The spliced micro light-emitting-diode display panel according to claim 16, further comprising:
a light-transmitting glue layer and a plurality of light-shielding parts, wherein the plurality of light-shielding parts are disposed on the plurality of circuit boards and are located between the plurality of micro light-emitting-diode modules, and the light-transmitting glue layer covers the plurality of light-shielding parts.

18. The spliced micro light-emitting-diode display panel according to claim 17, wherein heights of the plurality of light-shielding parts are not higher than a height of the light-blocking layer and not lower than heights of the plurality of light-emitting-diode units.

* * * * *